United States Patent
Lee et al.

(10) Patent No.: US 12,210,038 B2
(45) Date of Patent: Jan. 28, 2025

(54) METHOD OF MANUFACTURING A PROBE TIP AND A PROBE TIP MANUFACTURED BY THE SAME

(71) Applicant: TSE CO., LTD., Chungcheongnam-do (KR)

(72) Inventors: Young Min Lee, Chungcheongnam-do (KR); Ho Young Jung, Chungcheongnam-do (KR)

(73) Assignee: TSE CO., LTD., Chungcheongnam-do (KR)

( * ) Notice: Subject to any disclaimer, the term of this patent is extended or adjusted under 35 U.S.C. 154(b) by 121 days.

(21) Appl. No.: 18/152,905

(22) Filed: Jan. 11, 2023

(65) Prior Publication Data
US 2023/0366912 A1    Nov. 16, 2023

(30) Foreign Application Priority Data

May 11, 2022    (KR) .................. 10-2022-0057830

(51) Int. Cl.
    *G01R 1/067*    (2006.01)
    *C25D 5/02*    (2006.01)
    (Continued)

(52) U.S. Cl.
    CPC ......... *G01R 1/06761* (2013.01); *C25D 5/022* (2013.01); *C25D 5/10* (2013.01); *G01R 1/07342* (2013.01)

(58) Field of Classification Search
CPC ............ G01R 1/06761; G01R 1/07342; G01R 1/06738; G01R 1/06711; G01R 1/06733;
(Continued)

(56) References Cited

U.S. PATENT DOCUMENTS

| | | |
|---|---|---|
| 10,551,432 B2 | 2/2020 | Ishii et al. |
| 11,131,690 B2 | 9/2021 | Crippa |
| (Continued) | | |

FOREIGN PATENT DOCUMENTS

| | | |
|---|---|---|
| JP | 2006-228743 A | 8/2006 |
| KR | 10-1766261 B1 | 8/2017 |
| (Continued) | | |

OTHER PUBLICATIONS

Office Action dated Oct. 11, 2023 from Taiwanese priority Application No. 112101367 (15 pages including English translation).
(Continued)

*Primary Examiner* — G. M. A Hyder
(74) *Attorney, Agent, or Firm* — Crowell & Moring LLP; John C. Freeman, Esq.

(57) ABSTRACT

A probe tip according to an embodiment of the disclosure may include: a first plating layer including a first metal; a second plating layer disposed on one surface of the first plating layer and including a second metal of a material different from that of the first metal; and a third plating layer disposed on one surface of the second plating layer and including the first metal, wherein each of the first plating layer, the second plating layer, and the third plating layer extends in a length direction of the probe tip, and wherein the first plating layer, the second plating layer, and the third plating layer are stacked in a thickness direction of the probe tip.

19 Claims, 5 Drawing Sheets

(51) Int. Cl.
*C25D 5/10* (2006.01)
*G01R 1/073* (2006.01)

(58) Field of Classification Search
CPC .......... G01R 3/00; G01R 1/073; C25D 5/022; C25D 5/10
See application file for complete search history.

(56) References Cited

U.S. PATENT DOCUMENTS

| | | | |
|---|---|---|---|
| 2010/0213956 A1* | 8/2010 | Souma | G01R 1/06733 |
| | | | 430/319 |
| 2013/0162280 A1* | 6/2013 | Chung | B23K 31/02 |
| | | | 228/165 |
| 2015/0355235 A1 | 12/2015 | Hsu et al. | |
| 2017/0307657 A1* | 10/2017 | Crippa | G01R 1/06716 |
| 2018/0340976 A1 | 11/2018 | Ishii et al. | |
| 2020/0292580 A1 | 9/2020 | Wei et al. | |

FOREIGN PATENT DOCUMENTS

| | | |
|---|---|---|
| KR | 10-2017-0107465 A | 9/2017 |
| TW | 201629493 A | 8/2016 |
| TW | 201901175 A | 1/2019 |
| TW | M619170 U | 11/2021 |

OTHER PUBLICATIONS

Office Action dated Jul. 25, 2024 from Korean priority Application No. 10-2022-0057830 (17 pages including English translation).

* cited by examiner

METHOD OF MANUFACTURING A PROBE TIP AND A PROBE TIP MANUFACTURED BY THE SAME

CROSS-REFERENCE TO RELATED APPLICATION

This application is based on and claims priority under 35 U.S.C. § 119 to Korean Patent Application No. 10-2022-0057830 filed on May 11, 2022, in the Korean Intellectual Property Office, the disclosure of which is herein incorporated by reference in its entirety.

BACKGROUND

Field

The disclosure relates to a method for manufacturing a probe tip and a probe tip manufactured by the method.

Description of Related Art

A probe card is an interface that electrically connects a tester and a test subject with each other in electrical die sorting (EDS) for testing electrical characteristics of the test subject. The probe card may be used to test whether the test subject is defective by transferring an electrical signal having been transferred from the test subject to the tester (e.g., semiconductor inspection equipment).

The probe card may include a probe tip that is in direct contact with a pad (e.g., connection terminal of an external signal) of the test subject to transmit and receive the electrical signal to and from the pad. The probe card may include a plurality of probe tips, each of which comes in contact with the test subject to transmit and receive the electrical signal to and from the test subject. As the integrity of a semiconductor integrated circuit becomes higher, the spacing between the pads of the test subject becomes smaller, and the probe tip coming in contact with the pad becomes miniaturized.

SUMMARY

As a semiconductor device is miniaturized and micronized, a pad size of the semiconductor device may be reduced, and a probe tip that is used for electrical die sorting may also be micronized. The micronized probe tip has a degraded stiffness, and thus the breakability thereof may be increased due to a repetitive contact with a test subject. Accordingly, there is a need for a constitution of a probe tip and a method for manufacturing the probe tip, which can improve durability of the micronized probe tip.

An embodiment of the disclosure may provide a probe tip and a manufacturing method thereof, which can improve the durability of the micronized probe tip.

According to an embodiment of the disclosure, a probe tip may include: a first plating layer having a first thickness in a thickness direction of the probe tip, and including a first metal; a second plating layer disposed on one surface of the first plating layer, having a second thickness in the thickness direction of the probe tip, and including a second metal of a material different from that of the first metal; and a third plating layer disposed on one surface of the second plating layer, having a third thickness in the thickness direction of the probe tip, and including the first metal, wherein a hardness of the second plating layer is set up to be higher than a hardness of the first plating layer and a hardness of the third plating layer, wherein the second thickness is set to be larger than the first thickness and the third thickness, wherein each of the first plating layer, the second plating layer, and the third plating layer extends in a length direction of the probe tip, and wherein the first plating layer, the second plating layer, and the third plating layer are stacked in the thickness direction of the probe tip.

According to an embodiment of the disclosure, a method for manufacturing a probe tip may include: forming a base layer; forming a photoresist layer including an opening on one surface of the base layer; forming, in at least a part of the opening of the photoresist layer, a first plating layer having a first thickness in a vertical direction to one surface of the base layer, and including a first metal; forming, on one surface of the first plating layer, a second plating layer having a second thickness in a vertical direction to the one surface of the first plating layer, and including a second metal of a material different from that of the first metal; and forming, on one surface of the second plating layer, a third plating layer having a third thickness in a vertical direction to the one surface of the second plating layer, and including the first metal, wherein a hardness of the second plating layer is set up to be higher than a hardness of the first plating layer and a hardness of the third plating layer, wherein the second thickness is set to be larger than the first thickness and the third thickness, and wherein the first plating layer, the second plating layer, and the third plating layer are stacked in a direction in which they get farther away from the one surface of the base layer.

According to an embodiment of the disclosure, a probe tip may be manufactured by a method for manufacturing a probe tip, which may include: forming a base layer; forming a photoresist layer including an opening on one surface of the base layer; forming, in at least a part of the opening of the photoresist layer, a first plating layer having a first thickness in a vertical direction to one surface of the base layer, and including a first metal; forming, on one surface of the first plating layer, a second plating layer having a second thickness in a vertical direction to the one surface of the first plating layer, and including a second metal of a material different from that of the first metal; and forming, on one surface of the second plating layer, a third plating layer having a third thickness in a vertical direction to the one surface of the second plating layer, and including the first metal, wherein a hardness of the second plating layer is set to be higher than a hardness of the first plating layer and a hardness of the third plating layer, wherein the second thickness is set up to be larger than the first thickness and the third thickness, and wherein the first plating layer, the second plating layer, and the third plating layer are stacked in a direction in which they get farther away from the one surface of the base layer.

An embodiment of the disclosure can provide a method for manufacturing a probe tip having an improved durability.

An embodiment of the disclosure can provide a probe tip having an improved durability.

DETAILED DESCRIPTION

Figure 1:
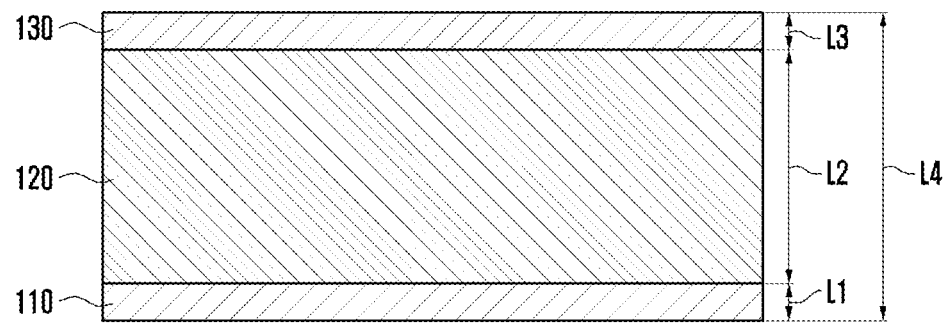
FIG. 1 illustrates a probe tip according to an embodiment of the disclosure.
Figure 1:
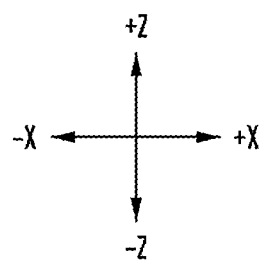

FIG. 1 illustrates a probe tip 100 according to an embodiment of the disclosure.

In explaining a probe tip 100 according to an embodiment of the disclosure, a thickness direction of the probe tip 100 may mean a z-axis direction, and a length direction of the probe tip 100 may mean an x-axis direction.

In an embodiment, the probe tip 100 may be formed to have a predetermined length in the length direction (e.g., x-axis direction) of the probe tip 100. The probe tip 100 may be a part that comes in contact with a test subject (not illustrated) in a probe card (not illustrated) for testing electrical characteristics. The probe tip 100 may be disposed in the form of projecting from at least a part of the probe card (not illustrated) in the length direction (e.g., x-axis direction) of the probe tip 100, and may come in contact with the test subject (not illustrated) at an end in the length direction of the probe tip 100.

In an embodiment, the probe tip 100 may include a first plating layer 110, a second plating layer 120, and/or a third plating layer 130.

In an embodiment, the first plating layer 110, the second plating layer 120, and the third plating layer 130 may be stacked in a thickness direction (e.g., z-axis direction) of the probe tip 100. For example, the second plating layer 120 may be disposed in a positive z-axis direction of the first plating layer 110. The third plating layer 130 may be disposed in a positive z-axis direction of the second plating layer 120.

In an embodiment, the third plating layer 130 may be disposed on one surface of the second plating layer 120. The first plating layer 110 may be disposed on the other surface of the second plating layer 120. The one surface of the second plating layer 120 may mean a surface that faces the positive z-axis direction from the second plating layer 120. The other surface of the second plating layer 120 may mean a surface that faces the negative z-axis direction from the second plating layer 120.

In an embodiment, each of the first plating layer 110, the second plating layer 120, and the third plating layer 130 may extend in a length direction (e.g., x-axis direction) of the probe tip 100.

In an embodiment, one end of the probe tip 100 may mean an end located in a negative x-axis direction based on the probe tip 100. The other end of the probe tip 100 may mean an end located in the positive x-axis direction based on the probe tip 100.

In an embodiment, at least a part of the probe tip 100 may come in contact with a test subject (e.g., semiconductor (not illustrated)) located outside. For example, the test subject located outside may be disposed at one end of the probe tip 100. The probe tip 100 may come in contact with the test subject located at one end of the probe tip 100 on the first plating layer 110, the second plating layer 120, and/or the third plating layer 130, and may transmit and receive an electrical signal to and from the test subject.

In an embodiment, the first plating layer 110, the second plating layer 120, and/or the third plating layer 130 may include a metal material.

In an embodiment, the first plating layer 110 and the third plating layer 130 may include a metal material of the same kind.

In an embodiment, the probe tip 100 may include a first metal and a second metal. For example, the first plating layer 110 and the third plating layer 130 may include the first metal. The second plating layer 120 may include the second metal. The second metal may have a material that is different from the material of the first metal.

In an embodiment, the first metal and the second metal may be composed of any one metal of nickel (Ni), beryllium (Be), copper (Cu), cobalt (Co), tungsten (W), and rhodium (Rh), or an alloy thereof.

In an embodiment, the first metal may have a hardness that is lower than the hardness of the second metal.

In an embodiment, the hardness of the first plating layer 110, the second plating layer 120, and/or the third plating layer 130 may mean Vickers hardness (HV).

In an embodiment, the first plating layer 110 and the third plating layer 130 may have a hardness lower than the hardness of the second plating layer 120. For example, the hardness of the first plating layer 110 and the third plating layer 130 may be about 520 Hv to 720 Hv. The hardness of the second plating layer 120 may be about 900 Hv to 1000 Hv.

In an embodiment, the first plating layer 110 and the third plating layer 130 may have the same hardness. For example, the first plating layer 110 and the third plating layer 130 may be formed to have the same hardness in the range of about 520 Hv to 720 Hv.

In an embodiment, a first thickness L1 may mean a thickness that the first plating layer 110 has in a thickness direction (e.g., z-axis direction) of the probe tip 100. A second thickness L2 may mean a thickness that the second plating layer 120 has in the thickness direction (e.g., z-axis direction) of the probe tip 100. A third thickness L3 may mean a thickness that the third plating layer 130 has in the thickness direction (e.g., z-axis direction) of the probe tip 100.

In an embodiment, a fourth thickness L4 may mean the total thickness of the probe tip 100, and may mean a thickness that the entire probe tip 100 has in the thickness direction (e.g., z-axis direction) of the probe tip 100.

In an embodiment, the first thickness L1 and the third thickness L3 may be set to be smaller than the second thickness L2.

In an embodiment, the sum of the first thickness L1 and the third thickness L3 may be set to be smaller than the second thickness L2. For example, the second thickness L2 may be set to about 55% to 95% of the fourth thickness L4. The sum of the first thickness L1 and the third thickness L3 may be set to about 5% to 45% of the fourth thickness L4. The second plating layer 120 of the probe tip 100 has a higher hardness than the first plating layer 110 and the third plating layer 130, and in order to strengthen the hardness of the entire probe tip 100, the ratio of the thickness of the second plating layer 120 to the thickness of the entire probe tip 100 may be set to be larger than the ratio of the sum of the thickness of the first plating layer 110 and the thickness of the third plating layer 130.

In an embodiment, the probe tip 100 may be formed in an asymmetric shape based on the second plating layer 120. For example, the probe tip 100 may be formed in a manner that the third plating layer 130 located on one surface of the second plating layer 120 and the first plating layer 110 located on the other surface of the second plating layer 120 have different thicknesses.

In an embodiment, the thickness of the first plating layer 110 and the thickness of the third plating layer 130 may be set to be different from each other. For example, the thickness of the first plating layer 110 may be set to be smaller than the thickness of the third plating layer 130, or the thickness of the first plating layer 110 may be set to be larger than the thickness of the third plating layer 130.

In an embodiment, at least a part of the probe tip 100 may include a symmetric shape. For example, the probe tip 100 may have a symmetric shape based on a virtual straight line that is parallel to the length direction (e.g., x-axis direction) of the probe tip 100 in the center point in the thickness direction (e.g., z-axis direction) of the probe tip 100. If the probe tip 100 includes the symmetric shape, the thickness of the first plating layer 110 and the thickness of the third plating layer 130 may be set to be equal to each other. For example, the first thickness L1 and the third thickness L3 may be set to be equal to each other.

In an embodiment, the first plating layer 110, the second plating layer 120, and/or the third plating layer 130 may be formed in an electroplating method.

Figure 2:
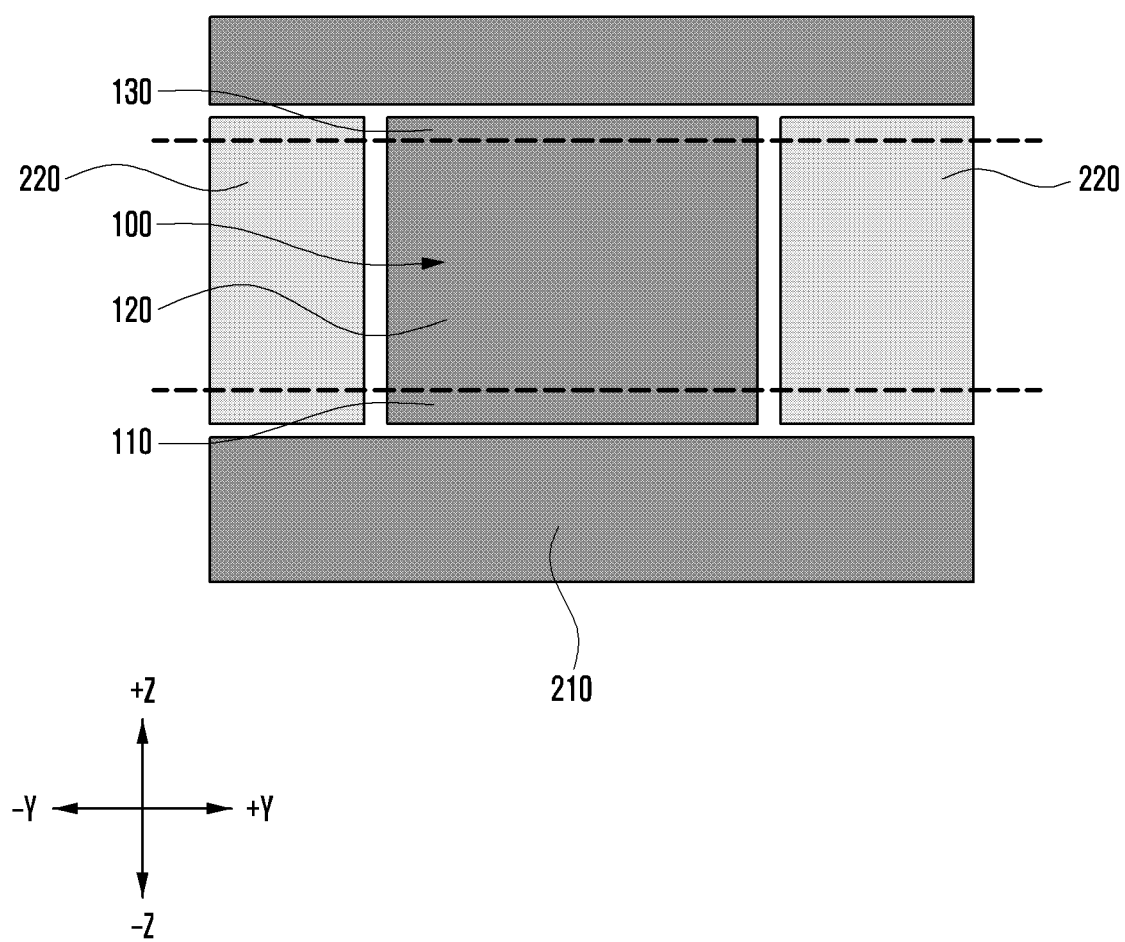
FIG. 2 illustrates a prototype of a probe tip according to an embodiment of the disclosure.

FIG. 2 illustrates a prototype of a probe tip 100 according to an embodiment of the disclosure.

FIG. 2 illustrates a prototype of a probe tip 100 corresponding to the probe tip 100 illustrated in FIG. 1.

With reference to FIG. 2, the probe tip 100 may include a first plating layer 110, a second plating layer 120, and/or a third plating layer 130.

In explaining the probe tip 100 according to an embodiment of the disclosure, a thickness direction of the probe tip 100 may mean a z-axis direction, and a width direction of the probe tip 100 may means a y-axis direction. The width direction (e.g., y-axis direction) of the probe tip 100 may mean a direction that is vertical to the thickness direction (e.g., z-axis direction) and a length direction (e.g., x-axis direction) (refer to FIG. 1).

With reference to FIG. 2, the third plating layer 130 may be disposed on one surface of the second plating layer 120, and the first plating layer 110 may be disposed on the other surface of the second plating layer 120. The one surface of the second plating layer 120 may mean a surface that faces the positive z-axis direction from the second plating layer 120. The other surface of the second plating layer 120 may mean a surface that faces the negative z-axis direction from the second plating layer 120.

In an embodiment, the first plating layer 110, the second plating layer 120, and the third plating layer 130 may be stacked in order based on the thickness direction (e.g., z-axis direction) of the probe tip 100.

With reference to FIG. 2, in the thickness direction (e.g., z-axis direction) of the probe tip 100, the thickness of the second plating layer 120 may be set to be larger than the thickness of the first plating layer 110 and the third plating layer 130.

In FIG. 2, a part illustrated to be disposed on one side (e.g., side surface located in the negative y-axis direction based on the probe tip 100) and the other side (e.g., side surface located in the positive y-axis direction based on the probe tip 100) of the probe tip 100 may be a photoresist layer 220 that is used to form the probe tip 100 by using a photoresist process. In FIG. 2, a layer disposed on the other surface (e.g., surface directed in the negative z-axis direction on the first plating layer 110) of the first plating layer 110 of the probe tip 100 may be a base layer 210 that serves to support the probe tip 100 in the process of manufacturing the probe tip 100.

Figure 3A:
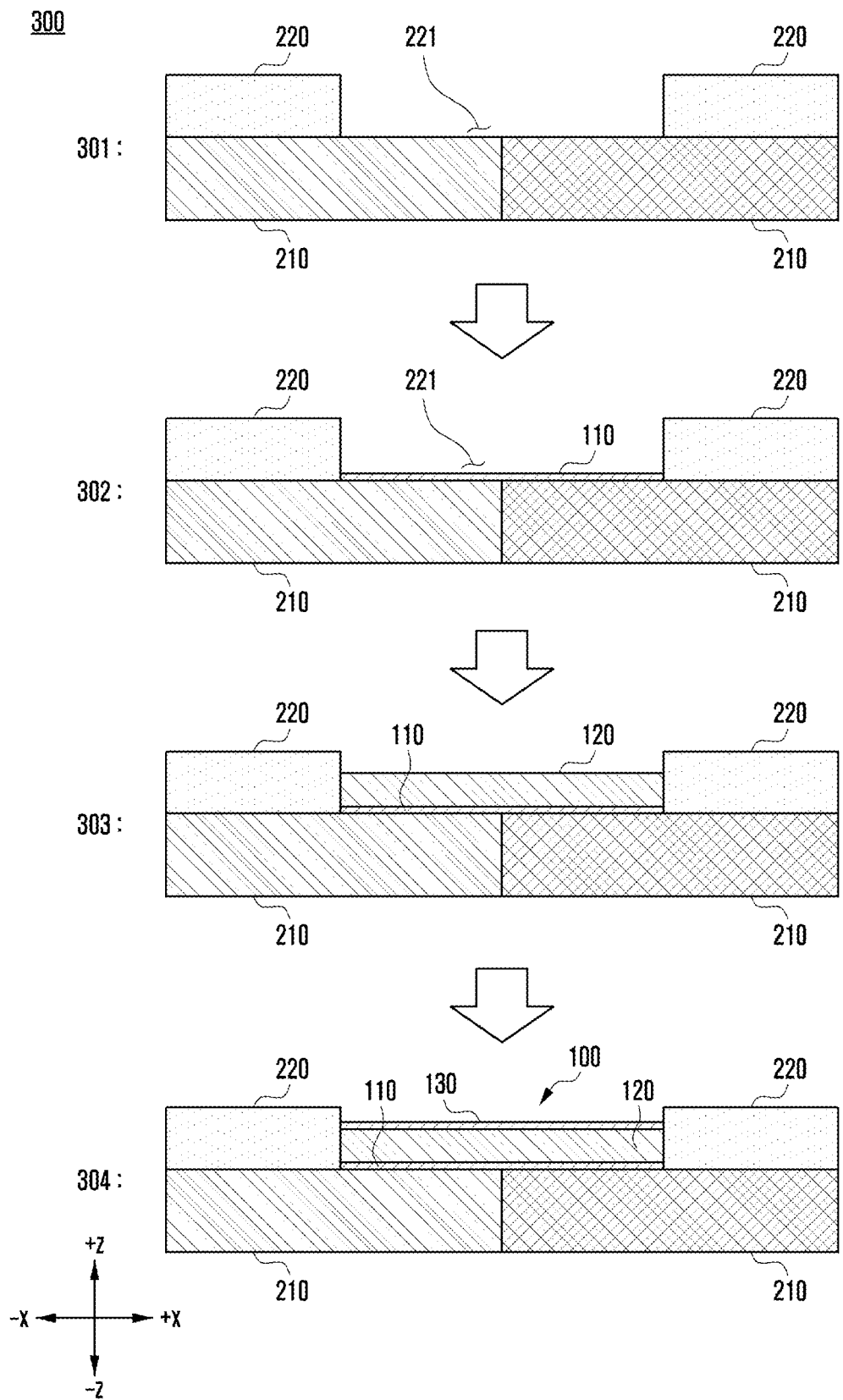
FIGS. 3A and 3B illustrate a method for manufacturing a probe tip according to an embodiment of the disclosure.

FIG. 3A illustrates a method 300 for manufacturing a probe tip 100 according to an embodiment of the disclosure.

Figure 3B:
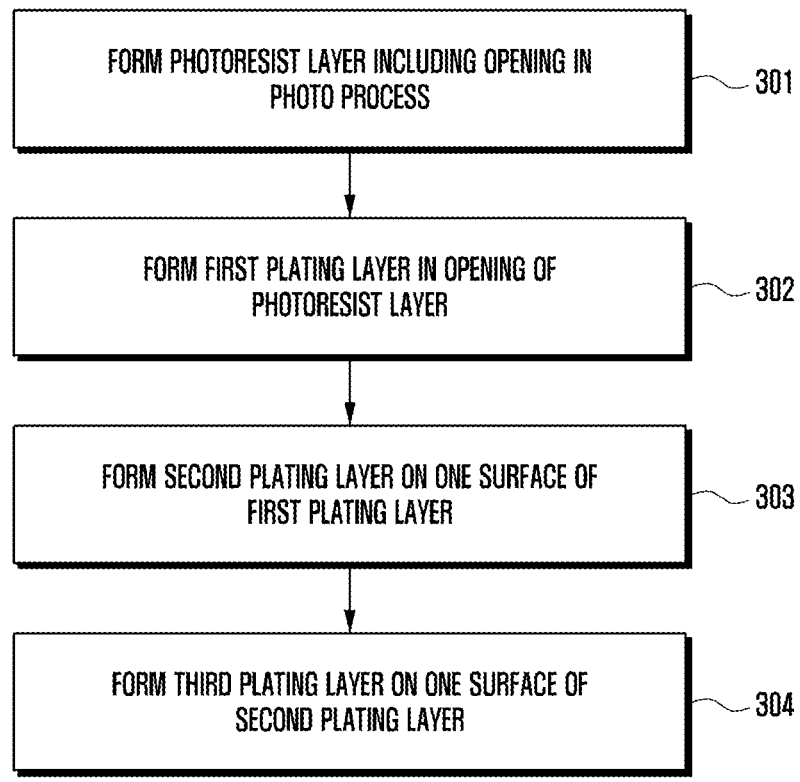

FIG. 3B is a flowchart illustrating a method 300 for manufacturing a probe tip 100 according to an embodiment of the disclosure.

With reference to FIGS. 3A and 3B, the method 300 for manufacturing a probe tip 100 according to an embodiment of the disclosure may include: forming a photoresist layer 220 (301), forming a first plating layer 110 (302), forming a second plating layer 120 (303), and/or forming a third plating layer 130 (304).

In step 301, a photoresist layer 220 including an opening 221 may be formed. The photoresist layer 220 may be formed through a photo process (e.g., photolithography process).

In an embodiment, a base layer 210 may be formed. In the method 300 for manufacturing the probe tip 100, the probe tip 100 may be disposed on one surface of the base layer 210. The base layer 210 may serve to support the probe tip 100 in the process of manufacturing the probe tip 100.

In an embodiment, the base layer 210 may include the same material as the material of the probe tip 100. For example, the base layer 210 may include a metal (e.g., first metal) included in the first plating layer 110 of the probe tip 100, or may include a metal (e.g., second metal) included in the second plating layer 120 of the probe tip 100.

In an embodiment, a plurality of base layers 210 may be formed, and the plurality of base layers 210 may include different materials. For example, in FIG. 3A, the base layer 210 located close to one end (e.g., end located in the negative x-axis direction based on the probe tip 100) of the probe tip 100 may include the first metal. The base layer 210 located close to the other end of the probe tip 100 may include the second metal. The first metal and the second metal may be composed of any one metal of nickel (Ni), beryllium (Be), copper (Cu), cobalt (Co), tungsten (W), and rhodium (Rh), or an alloy thereof.

In an embodiment, the photoresist layer 220 may be disposed on one surface of the base layer 210.

In an embodiment, the photoresist layer 220 may include an opening 221 on at least a part thereof.

In an embodiment, the photolithography process may include a resist formation process, an exposure process, and a development process. The resist formation process may include a process of forming a photoresist layer 220 of which the chemical characteristic may be changed by light. For example, in the resist formation process, the photoresist layer 220, which can be hardened or changed to have soluble characteristics when exposed to light, may be disposed on one surface (e.g., surface that faces the positive z-axis direction on the base layer 210) of the base layer 210. The photoresist layer 220 may include a dry film photoresist and a deposition material for attaching the dry film photoresist.

In an embodiment, the exposure process may include a process of selectively radiating light onto the photoresist layer 220 after covering a mask on which a pattern is formed on the photoresist layer 220. Through the exposure process, an area in which the opening 221 is to be formed may be displayed on the photoresist layer 220. For example, in the exposure process, light may be selectively radiated onto the photoresist layer 220 after a mask on which a pattern for displaying the opening 221 is formed covers the photoresist layer 220. The pattern formed on the mask may be formed in accordance with a positive or negative method. The positive method is a method for removing the area exposed to light by the mask, and the negative method is a method for removing an area that is unable to be exposed to light. In accordance with the pattern formed on the mask, the light may be radiated onto the area in which the opening 221 of the photoresist layer 220 is formed or the area in which the opening 221 of the photoresist layer 220 is not formed through the exposure process.

In an embodiment, the development process is a process of selectively removing a part onto which the light is radiated or a part onto which the light is not radiated from the photoresist layer 220 through a developer. Through the development process, the area corresponding to the opening 221 may be selectively removed from the photoresist layer 220. The photolithography process may include an etching process for removing a deposition material remaining after the development process.

In step 302, the first plating layer 110 may be formed on at least a part of the opening 221 of the photoresist layer 220. For example, the first plating layer 110 may be disposed in a space formed inside the opening 221 of the photoresist layer 220 on one surface of the base layer 210.

In an embodiment, the first plating layer 110 may be formed through an electroplating method. For example, the first plating layer 110 may be formed in a manner that a plating material (e.g., first metal) is plated on at least a part of the opening 221 of the photoresist layer 220 in the electroplating method.

In an embodiment, in order to form the first plating layer 110 in the electroplating method, one pole of a power for plating may be applied to a location where the first plating layer 110 is formed, and the other pole of the power for plating may be applied to the side of the plating material. For example, a cathode of the power for plating may be applied to the location (e.g., one surface of the base layer 210 on which the opening 221 is formed) where the first plating layer 110 is formed, and an anode of the power for plating may be applied to the plating material (e.g., first metal).

In an embodiment, the first plating layer 110 may have a thickness in a direction (e.g., z-axis direction) that is vertical to one surface of the base layer 210. The thickness of the first plating layer 110 may be a first thickness L1 (refer to FIG. 1). The first plating layer 110 may include the first metal.

In an embodiment, the hardness of the first plating layer 110 may be 520 Hv to 720 Hv. The hardness of the first plating layer 110 may mean a Vickers hardness.

In step 303, the second plating layer 120 may be formed on one surface of the first plating layer 110.

In an embodiment, the second plating layer 120 may be disposed on one surface of the first plating layer 110 in the space formed inside the opening 221 of the photoresist layer 220.

In an embodiment, the second plating layer 120 may be formed through the electroplating method. For example, the second plating layer 120 may be formed in a manner that the plating material (e.g., second metal) is plated on at least a part of the opening 221 of the photoresist layer 220 in the electroplating method.

In an embodiment, a different kind of metal from the metal of the first plating layer 110 may be used as the plating material of the second plating layer 120. For example, the second metal may be used as the plating material of the second plating layer 120, and the first metal may be used as the plating material of the first plating layer 110.

In an embodiment, in order to form the second plating layer 120 in the electroplating method, one pole of the power for plating may be applied to the location where the second plating layer 120 is formed, and the other pole of the power for plating may be applied to the side of the plating material (e.g., second metal). For example, the cathode of the power for plating may be applied to the location (e.g., one surface of the first plating layer 110 located inside the opening 221) where the second plating layer 120 is formed, and the anode of the power for plating may be applied to the plating material (e.g., second metal).

In an embodiment, the step 303 may include a surface treatment process for strengthening the adhesion of the first plating layer 110 and the second plating layer 120.

In an embodiment, the surface treatment process may include a dry ashing process. The dry ashing process may mean a process of removing the residual material (e.g., photoresist layer 220) before the plating in order to facilitate the plating of the second plating layer 120. As the dry ashing process, an ashing process using plasma may be used. For example, by removing the residual material (e.g., photoresist layer 220) by using oxygen plasma, the second plating layer 120 may be easily plated on one surface of the first plating layer 110.

In an embodiment, the surface treatment process may include a process (e.g., pretreatment process) of removing foreign substances attached to the one surface of the first plating layer 110 by chemicals before forming the second plating layer 120 on one surface of the first plating layer 110. For example, the foreign substances that are different from the material of the first plating layer 110 formed on the surface of the first plating layer 110 may be chemically removed. The foreign substances on the surface of the first plating layer 110 may be chemically removed through the surface treatment process, and thus the adhesion of the first plating layer 110 and the second plating layer 120 can be strengthened.

In an embodiment, the surface treatment process may include a process (e.g., post-treatment process) of preventing the second plating layer 120 from being polluted by the foreign substances after the second plating layer 120 is formed on one surface of the first plating layer 110. For example, after the second plating layer 120 is formed, the surface of the second plating layer 120 is dried or heated, or a separate coating layer is formed on the surface of the second plating layer 120, so that the pollution due to the foreign substances can be prevented.

In an embodiment, the second plating layer 120 may have a thickness in a direction (e.g., z-axis direction) that is vertical to one surface of the first plating layer 110. The thickness of the second plating layer 120 may be a second thickness L2 (refer to FIG. 1). The second plating layer 120 may include the second metal.

In an embodiment, the second plating layer 120 may be formed to be thicker than the first plating layer 110.

In an embodiment, the hardness of the second plating layer 120 may be set to be higher than the hardness of the plating layer 110. For example, the hardness of the first plating layer 110 may be about 520 Hv to 720 Hv, and the hardness of the second plating layer 120 may be about 900 Hv to 1000 Hv.

In step 304, the third plating layer 130 may be formed on one surface of the second plating layer 120.

In an embodiment, the third plating layer 130 may be disposed on one surface of the second plating layer 120 in a space formed inside the opening 221 of the photoresist layer 220.

In an embodiment, the third plating layer 130 may be formed through the electroplating method. For example, the third plating layer 130 may be formed so that the plating material (e.g., first metal) is plated on at least a part of the opening 221 of the photoresist layer 220 in the electroplating method.

In an embodiment, as the plating material of the third plating layer 130, the same kind of metal as the metal of the first plating layer 110 may be used. For example, as the plating material of the third plating layer 130, the first metal that is the plating material of the first plating layer 110 may be used.

In an embodiment, in order to form the third plating layer 130 in the electroplating method, one pole of the power for plating may be applied to the location where the third plating layer 130 is formed, and the other pole of the power for plating may be applied to the side of the plating material (e.g., first metal). For example, the cathode of the power for plating may be applied to the location (e.g., one surface of the second plating layer 120 located inside the opening 221) where the third plating layer 130 is formed, and the anode of the power for plating may be applied to the plating material (e.g., first metal).

In an embodiment, the step 304 may include the surface treatment process for strengthening the adhesion of the second plating layer 120 and the third plating layer 130.

In an embodiment, the surface treatment process may include the dry ashing process. The dry ashing process may mean a process of removing the residual material (e.g., photoresist layer 220) before the plating in order to facilitate the plating of the third plating layer 130. As the dry ashing process, an ashing process using plasma may be used. For example, by removing the residual material (e.g., photoresist layer 220) by using oxygen plasma, the third plating layer 130 may be easily plated on one surface of the second plating layer 120.

In an embodiment, the surface treatment process may include a process (e.g., pretreatment process) of removing the foreign substances attached to the one surface of the second plating layer 120 by chemicals before forming the third plating layer 130 on one surface of the second plating layer 120. For example, the foreign substances that are different from the material of the second plating layer 120 formed on the surface of the second plating layer 120 may be chemically removed. The foreign substances on the surface of the second plating layer 120 may be chemically removed through the surface treatment process, and thus the adhesion of the second plating layer 120 and the third plating layer 130 can be strengthened.

In an embodiment, the surface treatment process may include the process (e.g., post-treatment process) of preventing the third plating layer 130 from being polluted by the foreign substances after the third plating layer 130 is formed on one surface of the second plating layer 120. For example, after the third plating layer 130 is formed, the surface of the third plating layer 130 is dried or heated, or a separate coating layer is formed on the surface of the third plating layer 130, so that the pollution due to the foreign substances can be prevented.

In an embodiment, the third plating layer 130 may have a thickness in the direction (e.g., z-axis direction) that is vertical to one surface of the second plating layer 120. The thickness of the third plating layer 130 may be a third thickness L3 (refer to FIG. 1). The third plating layer 130 may include the first metal.

In an embodiment, the thickness of the second plating layer 120 may be set to be larger than the thickness of the first plating layer 110 and the thickness of the third plating layer 130.

In an embodiment, the third plating layer 130 may be formed to have the same thickness as the thickness of the first plating layer 110.

In an embodiment, the thickness of the first plating layer 110 and the thickness of the third plating layer 130 may be set to be different from each other. For example, the thickness of the first plating layer 110 may be set to be smaller than the thickness of the third plating layer 130, or the thickness of the first plating layer 110 may be set to be larger than the thickness of the third plating layer 130.

In an embodiment, the third plating layer 130 may have the same hardness as the hardness of the first plating layer 110. For example, the hardness of the third plating layer may be 520 Hv to 720 Hv.

In an embodiment, the first thickness L1 and the third thickness L3 may be set to be smaller than the second thickness L2.

In an embodiment, the sum of the first thickness L1 and the third thickness L3 may be set to be smaller than the second thickness L2.

In an embodiment, after the third plating layer 130 is formed in step 304, the photoresist layer 220 may be removed.

Figure 4:
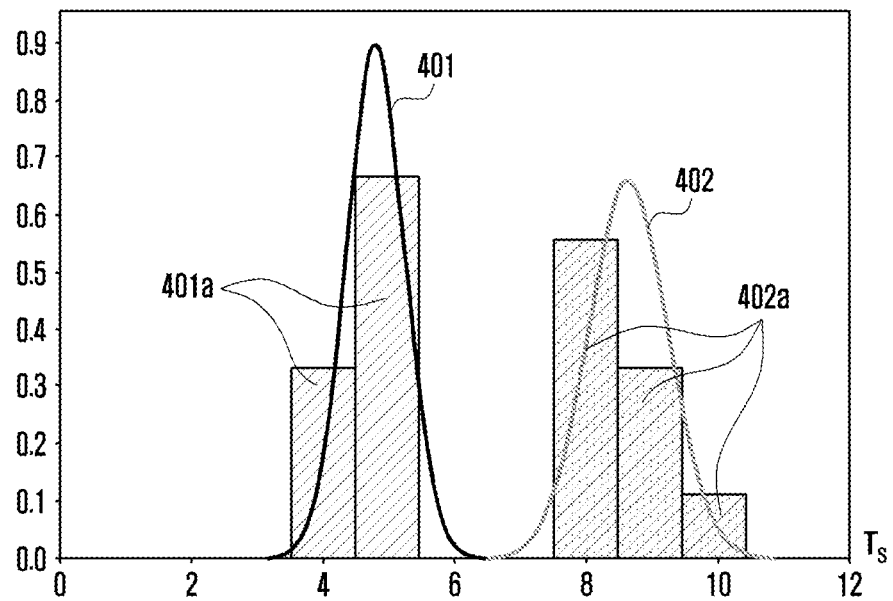
FIG. 4 is a graph illustrating a shear stress at a time when a probe tip according to an embodiment of the disclosure is broken.

FIG. 4 is a graph illustrating a shear stress Ts at a time when a probe tip 100 according to an embodiment of the disclosure is broken.

In an embodiment, the horizontal axis of the graph illustrated in FIG. 4 may mean a value of a shear stress Ts at a time when the probe tip 100 breaks. The vertical axis of the graph illustrated in FIG. 4 may mean a value of a probability density function of the value of the shear stress Ts at the time when the probe tip 100 breaks.

In an embodiment, in a process in which the probe tip 100 comes in contact with the test subject (not illustrated), the probe tip 100 may receive a force transferred from the outside in the thickness direction (e.g., z-axis direction) (refer to FIG. 1) of the probe tip 100, in the length direction (e.g., x-axis direction) (refer to FIG. 1) of the probe tip 100, and/or in the width direction (e.g., y-axis direction) (refer to FIG. 2) of the probe tip 100.

In an embodiment, the shear stress Ts may mean a stress that occurs at the probe tip 100 by a force being transferred in a direction that is substantially vertical to the length direction (e.g., x-axis direction) (refer to FIG. 1) of the probe tip 100. If the shear stress Ts that is equal to or stronger than a predetermined criterion occurs in the probe tip 100, the probe tip 100 may be damaged.

In an embodiment, the strength of the probe tip 100 may be measured through the value of the shear stress Ts at the time when the probe tip 100 is damaged. As the strength of the probe tip 100 becomes stronger, the probe tip 100 can endure more force, and thus a larger value of the shear stress Ts may appear at the time when the probe tip 100 is damaged.

The graphs 401 and 401a may be graphs representing the distribution of the values of the shear stress Ts at the time when the probe tip in the related art is damaged through plural times measurement thereof. For example, among the graphs illustrated in FIG. 4, the graph 401 may mean the probability density function value of the shear stress Ts at the time when the probe tip in the related art is damaged. The graph 401a may mean a histogram corresponding to the probability density function value of the shear stress Ts of the probe tip in the related art.

The graphs 402 and 402a may be graphs representing the distribution of the values of the shear stress Ts at the time when the probe tip 100 according to an embodiment of the disclosure is damaged through plural times measurement thereof. For example, among the graphs illustrated in FIG. 4, the graph 402 may mean the probability density function value of the shear stress Ts at the time when the probe tip 100 according to an embodiment of the disclosure is damaged. The graph 402a may mean a histogram corresponding to the probability density function value of the shear stress Ts of the probe tip 100 according to an embodiment of the disclosure.

With reference to FIG. 4, the shear stress Ts at the time when the probe tip 100 according to an embodiment of the disclosure is damaged as illustrated in the graph 402 may be formed to be larger than the shear stress Ts at the time when the probe tip in the related art is damaged as illustrated in the graph 401. For example, as compared with the graph 401, the graph 402 may be formed at a moved location in the form of having a larger value of shear stress Ts in the same vertical-axis location. Further, as compared with the graph 401*a*, the graph 402*a* may be formed at a moved location in the form of having a larger value of shear stress Ts in the same vertical-axis location.

With reference to the graphs 401 and 402, as compared with the probe tip in the related art, the probe tip 100 according to an embodiment of the disclosure shows a larger shear stress Ts at the time when the probe tip 100 is damaged, and thus the strength of the probe tip 100 according to an embodiment of the disclosure may be greater than the strength of the probe tip in the related art.

In an embodiment, the shear stress Ts at the time when the probe tip 100 according to an embodiment of the disclosure is damaged may be increased by about 80% as compared with the shear stress Ts at the time when the probe tip 100 in the related art is damaged. For example, the probe tip 100 in the related art may endure the shear stress Ts as much as 100, whereas the probe tip 100 according to an embodiment of the disclosure may endure the shear stress Ts as much as about 180.

What is claimed is:

1. A probe tip in contact with a test subject comprising:
a first plating layer having a first thickness in a thickness direction of the probe tip, and including a first metal;
a second plating layer disposed on one surface of the first plating layer, having a second thickness in the thickness direction of the probe tip, and including a second metal of a material different from that of the first metal;
a third plating layer disposed on one surface of the second plating layer, having a third thickness in the thickness direction of the probe tip, and including the first metal;
wherein a hardness of the second plating layer is set to be higher than a hardness of the first plating layer and a hardness of the third plating layer;
wherein the second thickness is set up to be larger than the first thickness and the third thickness;
wherein each of the first plating layer, the second plating layer, and the third plating layer extends in a length direction of the probe tip;
wherein the first plating layer, the second plating layer, and the third plating layer are stacked in the thickness direction of the probe tip;
wherein the hardness of the first plating layer and the hardness of the third plating layer are 520 Hv to 720 Hv; and
wherein the hardness of the second plating layer is 900 Hv to 1000 Hv.

2. The probe tip of claim 1, wherein the first thickness of the first plating layer is set up to be equal to the third thickness of the third plating layer, and
wherein the hardness of the first plating layer is set up to be equal to the hardness of the third plating layer.

3. The probe tip of claim 1, wherein the first thickness of the first plating layer and the third thickness of the third plating layer are set up to be different from each other.

4. The probe tip of claim 1, wherein the second thickness of the second plating layer is set up to be larger than a sum of the first thickness of the first plating layer and the third thickness of the third plating layer.

5. The probe tip of claim 4, wherein the second thickness of the second plating layer is set up to 55% to 95% of the total thickness of the probe tip.

6. A method for manufacturing a probe tip that is to be in contact with a test subject, the method comprising:
forming a base layer;
forming a photoresist layer including an opening on one surface of the base layer;
forming, in at least a part of the opening of the photoresist layer, a first plating layer having a first thickness in a vertical direction to one surface of the base layer, and comprising a first metal;
forming, on one surface of the first plating layer, a second plating layer having a second thickness in a vertical direction to the one surface of the first plating layer, and comprising a second metal of a material different from that of the first metal; and
forming, on one surface of the second plating layer, a third plating layer having a third thickness in a vertical direction to the one surface of the second plating layer and comprising the first metal;
wherein the base layer comprises:
a first base layer supporting a portion of the first plating layer and comprising the first metal; and
a second base layer supporting another portion of the first plating layer and comprising the second metal; and
wherein a hardness of the second plating layer is set to be higher than a hardness of the first plating layer and a hardness of the third plating layer;
wherein the second thickness is set to be larger than the first thickness and the third thickness; and
wherein the first plating layer, the second plating layer, and the third plating layer are stacked in a direction in which they get farther away from the one surface of the base layer.

7. The method of claim 6, wherein the first thickness of the first plating layer is set up to be equal to the third thickness of the third plating layer, and
wherein the hardness of the first plating layer is set up to be equal to the hardness of the third plating layer.

8. The method of claim 6, wherein the first thickness of the first plating layer and the third thickness of the third plating layer are set to be different from each other.

9. The method of claim 6, wherein the hardness of the first plating layer and the hardness of the third plating layer are 520 Hv to 720 Hv, and
wherein the hardness of the second plating layer is 900 Hv to 1000 Hv.

10. The method of claim 6, wherein forming, on one surface of the first plating layer, a second plating layer having a second thickness in a vertical direction to the one surface of the first plating layer and comprising a second metal of a material different from that of the first metal comprises performing surface treatment for strengthening adhesion of the first plating layer and the second plating layer.

11. The method of claim 6, wherein forming, on one surface of the second plating layer, a third plating layer having a third thickness in a vertical direction to the one surface of the second plating layer and comprising the first metal comprises performing surface treatment for strengthening adhesion of the second plating layer and the third plating layer.

12. The method of claim 6, wherein the second thickness of the second plating layer is set up to be larger than a sum of the first thickness of the first plating layer and the third thickness of the third plating layer.

13. The method of claim 12, wherein the second thickness of the second plating layer is set up to 55% to 95% of the total thickness of the probe tip.

14. The method of claim 6, wherein the first plating layer, the second plating layer, and the third plating layer are formed by using an electroplating method.

15. A probe tip to be in contact with a test subject and manufactured by a method for manufacturing the probe tip, the method comprising:
   forming a base layer;
   forming a photoresist layer including an opening on one surface of the base layer;
   forming, in at least a part of the opening of the photoresist layer, a first plating layer having a first thickness in a vertical direction to one surface of the base layer, and including a first metal;
   forming, on one surface of the first plating layer, a second plating layer having a second thickness in a vertical direction to the one surface of the first plating layer, and including a second metal of a material different from that of the first metal; and
   forming, on one surface of the second plating layer, a third plating layer having a third thickness in a vertical direction to the one surface of the second plating layer, and including the first metal,
   wherein the base layer comprises:
      a first base layer supporting a portion of the first plating layer and comprising the first metal; and
      a second base layer supporting another portion of the first plating layer and comprising the second metal; and
   wherein a hardness of the second plating layer is set to be higher than a hardness of the first plating layer and a hardness of the third plating layer;
   wherein the second thickness is set to be larger than the first thickness and the third thickness; and
   wherein the first plating layer, the second plating layer, and the third plating layer are stacked in a direction in which they get farther away from the one surface of the base layer.

16. The probe tip of claim 15, wherein the first thickness of the first plating layer is set to be equal to the third thickness of the third plating layer, and
   wherein the hardness of the first plating layer is set to be equal to the hardness of the third plating layer.

17. The probe tip of claim 15, wherein the first thickness of the first plating layer and the third thickness of the third plating layer are set to be different from each other.

18. The probe tip of claim 15, wherein the hardness of the first plating layer and the hardness of the third plating layer are 520 Hv to 720 Hv, and
   wherein the hardness of the second plating layer is 900 Hv to 1000 Hv.

19. The probe tip of claim 15, wherein the second thickness of the second plating layer is set up to be larger than a sum of the first thickness of the first plating layer and the third thickness of the third plating layer.

* * * * *